(12) United States Patent
Parks et al.

(10) Patent No.: US 7,508,432 B2
(45) Date of Patent: Mar. 24, 2009

(54) CCD WITH IMPROVED SUBSTRATE VOLTAGE SETTING CIRCUIT

(75) Inventors: Christopher Parks, Rochester, NY (US); John P. McCarten, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 440 days.

(21) Appl. No.: 11/488,961

(22) Filed: Jul. 19, 2006

(65) Prior Publication Data

US 2008/0017892 A1    Jan. 24, 2008

(51) Int. Cl.
*H04N 3/14* (2006.01)
*H04N 5/335* (2006.01)
*H04N 9/64* (2006.01)
*H01L 21/00* (2006.01)

(52) U.S. Cl. .............. 348/299; 348/249; 348/314; 348/322; 257/230; 438/79

(58) Field of Classification Search ........... 348/299, 348/248, 249, 313, 311, 314, 320, 322; 257/223, 257/230, 232; 438/79
See application file for complete search history.

(56) References Cited

U.S. PATENT DOCUMENTS

| | | | |
|---|---|---|---|
| 5,150,216 A | | 9/1992 | Tokitou et al. |
| 5,159,418 A | * | 10/1992 | Tokuno ............... 257/235 |
| 5,426,317 A | * | 6/1995 | Hirota ............... 257/230 |
| 5,631,705 A | * | 5/1997 | Tani ............... 348/314 |
| 5,786,852 A | * | 7/1998 | Suzuki et al. ............... 348/322 |
| 5,828,407 A | * | 10/1998 | Suzuki ............... 348/312 |
| 5,867,055 A | | 2/1999 | Asaumi et al. |
| 5,978,024 A | * | 11/1999 | Lee ............... 348/314 |
| 6,104,072 A | * | 8/2000 | Hirota ............... 257/405 |
| 6,188,092 B1 | | 2/2001 | Hatano et al. |
| 6,515,703 B1 | * | 2/2003 | Suzuki et al. ............... 348/317 |
| 6,559,889 B2 | * | 5/2003 | Tanaka et al. ............... 348/299 |
| 6,778,002 B2 | * | 8/2004 | Miyazaki et al. ............... 327/534 |
| 6,982,751 B1 | * | 1/2006 | Tanaka ............... 348/220.1 |
| 7,102,680 B2 | * | 9/2006 | Mori et al. ............... 348/314 |

(Continued)

FOREIGN PATENT DOCUMENTS

EP    0 451 856    10/1991

(Continued)

*Primary Examiner*—John M Villecco
(74) *Attorney, Agent, or Firm*—Peyton C. Watkins

(57) ABSTRACT

An image sensor includes a plurality of pixels for converting incident photons into electrical charge; an overflow drain to draw off excess charge from at one or more of the pixels; a mechanism for summing charge from two or more of the pixels; a first network of resistive devices generating a first overflow drain voltage where at least one of the resistive devices has, in parallel, a fuse that can be opened in response to an external stimulus to provide the optimum overflow drain voltage for pixel anti-blooming protection and saturation signal level for when a plurality of pixels are summed together; and a second network of resistive devices connected to the first network of resistive devices generating a second overflow drain voltage where the second overflow drain voltage is a fraction of the first overflow drain voltage and the second overflow drain voltage provides the optimum overflow drain voltage for pixel anti-blooming and saturation signal level for when none or substantially none of the plurality of pixels are summed together.

36 Claims, 9 Drawing Sheets

U.S. PATENT DOCUMENTS

| | | | |
|---|---|---|---|
| 7,365,786 B2 * | 4/2008 | Kohno et al. | 348/314 |
| 2001/0010553 A1 * | 8/2001 | Tanaka et al. | 348/311 |
| 2001/0038064 A1 | 11/2001 | Mori et al. | |
| 2005/0062857 A1 * | 3/2005 | Yamamoto et al. | 348/222.1 |
| 2005/0243195 A1 | 11/2005 | Parks | |
| 2007/0023785 A1 * | 2/2007 | Hasuka et al. | 348/294 |
| 2007/0165128 A1 * | 7/2007 | Kato | 348/311 |
| 2008/0017892 A1 * | 1/2008 | Parks et al. | 257/223 |

FOREIGN PATENT DOCUMENTS

| | | | |
|---|---|---|---|
| EP | 0 831 641 | | 3/1998 |
| JP | 06-153079 | | 5/1994 |
| JP | 09139486 A | * | 5/1997 |
| JP | 2000133791 A | * | 5/2000 |
| JP | 2002-231889 | | 8/2002 |
| JP | 2005006201 A | * | 1/2005 |
| JP | 2005260407 A | * | 9/2005 |
| JP | 2005277398 A | * | 10/2005 |

* cited by examiner

CCD WITH IMPROVED SUBSTRATE VOLTAGE SETTING CIRCUIT

FIELD OF THE INVENTION

The invention relates generally to the field of charge-coupled devices and, more particularly, to providing more than one substrate voltage reference for optimum anti-blooming protection in pixel summing modes.

BACKGROUND OF THE INVENTION

FIG. 2 shows an interline charge-coupled device (CCD) 100. It includes an array of photodiodes 105 connected to vertical CCD 110 (VCCD). The image readout process begins by transferring charge from the photodiodes 105 to the adjacent VCCDs 110. Next, one line at a time is transferred into the horizontal CCD (HCCD) 115. The HCCD serially transfers charge to an output charge-sensing amplifier 120.

FIG. 3 shows a cross section of one interline CCD pixel (with portions of adjacent pixels shown for clarity) of FIG. 2. The photodiode 105 collects photo-generated charge. The charge is confined in the photodiode 105 by a surface pinning p+ implant 230 and a vertical overflow drain 215. Adjacent to the photodiode 105 is the VCCD buried channel 200 built in a p-type well 205 on an n-type substrate 210. Transfer of charge through the VCCD 110 is controlled by the gate 220. The VCCD 110 is shielded from light by an opaque metal layer 225.

The overflow drain 215 is a lightly doped region that has a high degree of manufacturing process variability. The variability is so great that the voltage applied to the substrate 210 must by changed from one image sensor to the next. The substrate voltage controls how much charge can be held in the photodiode 105. If the charge capacity of the photodiode is too high, then a bright spot of light will generate more charge than can be held in the VCCD 110. This causes VCCD blooming. If the charge capacity is too low, then the output amplifier 120 will never reach saturation. The substrate voltage is adjusted for each individual image sensor to optimize the photodiode charge capacity for the best compromise between anti-blooming protection and saturation signal level.

In the past, image sensors have been fabricated with a substrate reference voltage generation circuit. One such circuit is shown in FIG. 1. This circuit contains four fuses, F1 through F4, across a set of resistors in series, R1 through R4. By blowing one or more of the fuses, 16 possible reference voltage combinations V1 are possible. This reference voltage is then connected to the image sensor substrate for optimum anti-blooming and saturation signal.

There are many examples of such voltage divider type fuse or anti-fuse setting circuits for image sensors. They include U.S. Pat. Nos. 5,150,216; 5,867,055; 6,188,092; Japanese Patent 1994153079; and Japanese Patent 2002231889. From the prior art, it is clear that the resistors may be substituted by MOSFET transistors with the gates tied to the transistor source or drain.

One significant deficiency of the prior art is when interline CCDs are used to sum pixels. A simple example is shown in FIG. 4. An interline CCD 100 is shown where two rows of charge from the VCCD 110 is summed into the HCCD 115. This summing process may cause the HCCD 115 charge capacity to be exceeded and result in horizontal charge blooming. It is also possible to sum pixels together in the VCCD to increase frame rates. The pixel summing in the VCCD may exceed the VCCD charge capacity. A well-known solution to prevent blooming of the VCCD or HCCD when summing pixels is to further increase the substrate voltage when in pixel summing mode.

FIG. 5 illustrates the photodiode 105 channel potential vs. depth in the silicon wafer. At the surface, the pinning layer 230 holds the potential at 0V. The n-type photodiode 105 and lightly doped overflow drain 215 form a potential barrier between the photodiode and substrate 210. When the substrate voltage is set to VSub1, the photodiode capacity is larger at $\Delta VB$. When the image sensor changes to pixel summing mode, then the substrate voltage is increased to VSub2 which lowers the photodiode charge capacity to $\Delta VA$.

The problem is how to generate a second reference voltage. The obvious solution would be to place an entire second reference voltage generator on the image sensor like that shown in FIG. 1. This is undesirable because adding more fuses to the image sensor requires extra bond pads for a wafer probe tester to be able to set the fuses. Even if laser trimmed fuses are used, the additional fuses decrease the manufacturing yield of the sensor and increases the chance of debris from the fuse setting process contaminating the pixel array. Therefore, a new circuit is needed that does not increase the number of fuses and can supply more than one reference voltage for pixel summing image sensors.

SUMMARY OF THE INVENTION

The present invention is directed to overcoming one or more of the problems set forth above. Briefly summarized, according to one aspect of the present invention, the invention resides in an image sensor comprising (a) plurality of pixels for converting incident photons into electrical charge; (b) an overflow drain to draw off excess charge from at one or more of the pixels; (c) a mechanism for summing charge from two or more of the pixels; (d) a first network of resistive devices generating a first overflow drain voltage where at least one of the resistive devices has, in parallel, a fuse that can be opened in response to an external stimulus to provide the optimum overflow drain voltage for pixel anti-blooming protection and saturation signal level for when a plurality of pixels are summed together; and (e) a second network of resistive devices connected to the first network of resistive devices generating a second overflow drain voltage where the second overflow drain voltage is a fraction of the first overflow drain voltage and the second overflow drain voltage provides the optimum overflow drain voltage for pixel anti-blooming and saturation signal level for when none or substantially none of the plurality of pixels are summed together.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention provides the advantage of a simple image sensor substrate voltage circuit that can supply multiple substrate reference voltages without increasing the number of programmable fuse elements.

DETAILED DESCRIPTION OF THE INVENTION

Figure 1:
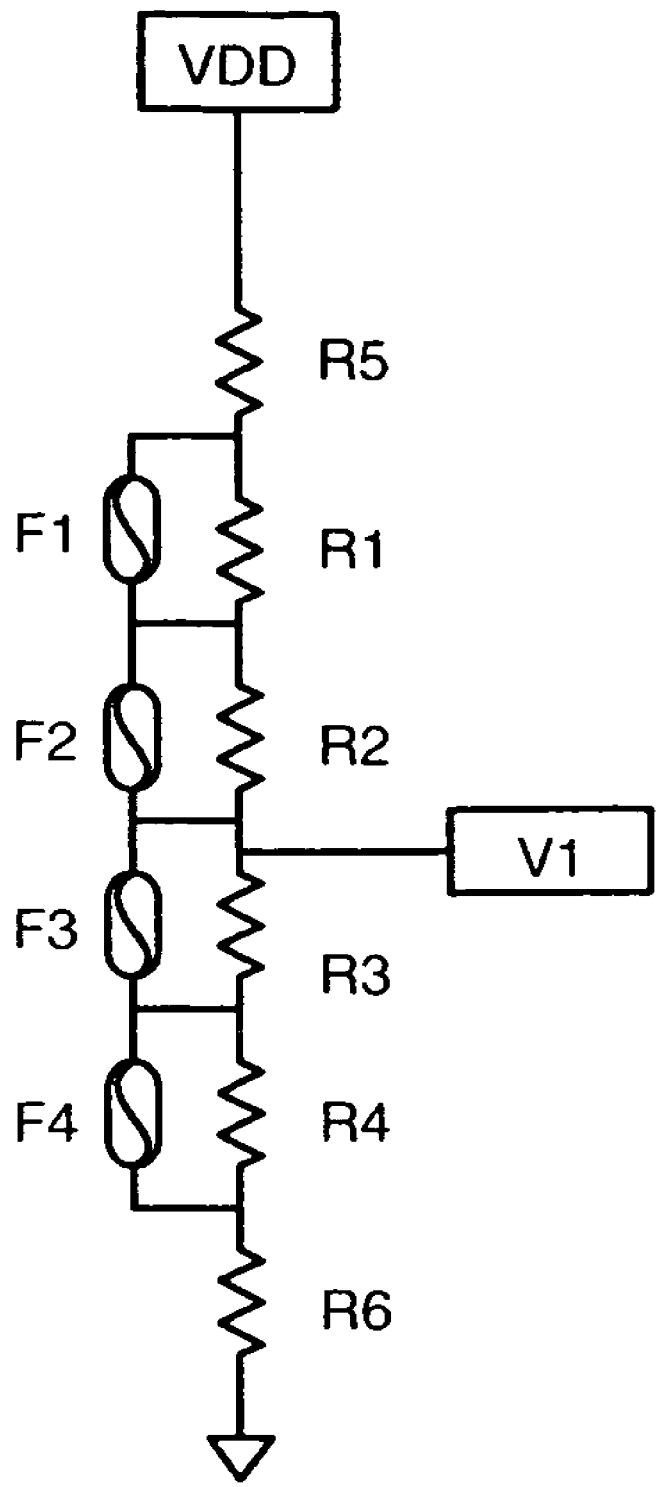
FIG. 1 is a schematic of a prior art substrate voltage reference circuit.
Figure 2:
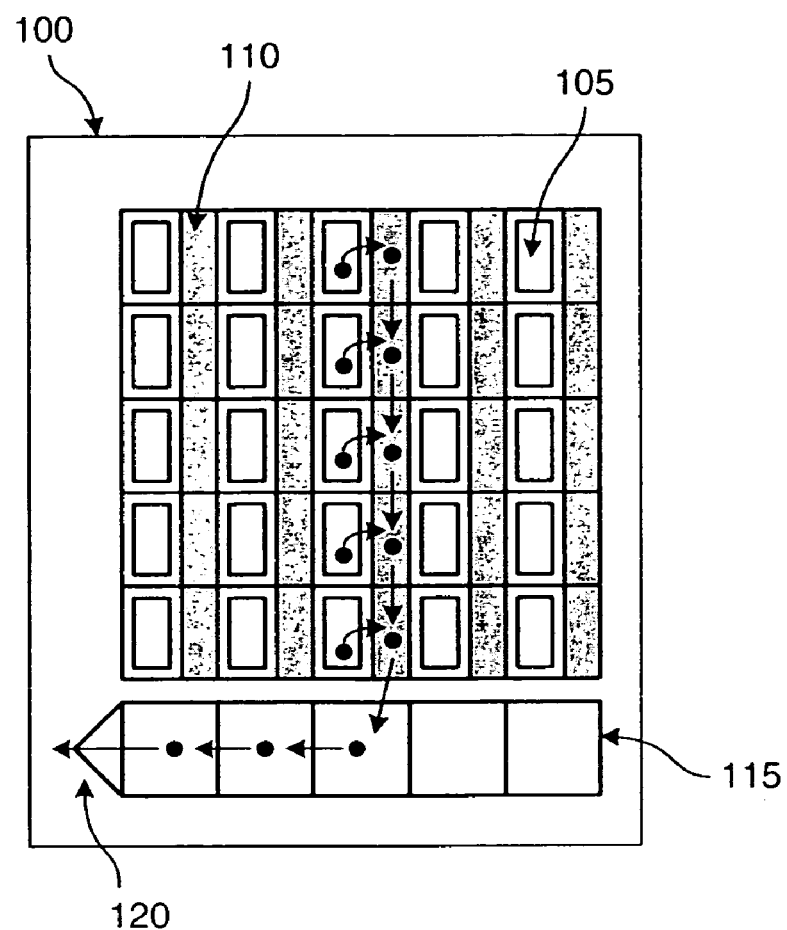
FIG. 2 is a top view of a prior art interline CCD.
Figure 3:
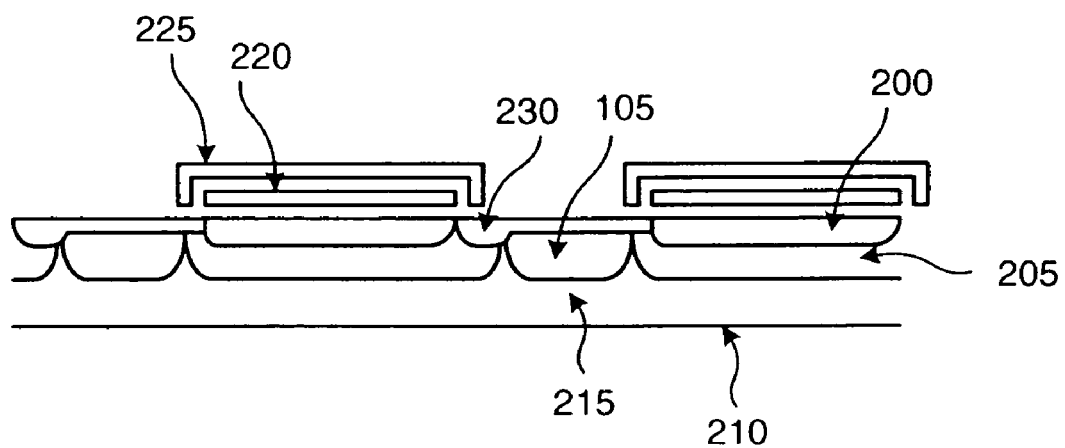
FIG. 3 is a cross section of a pixel FIG. 2.
Figure 4:
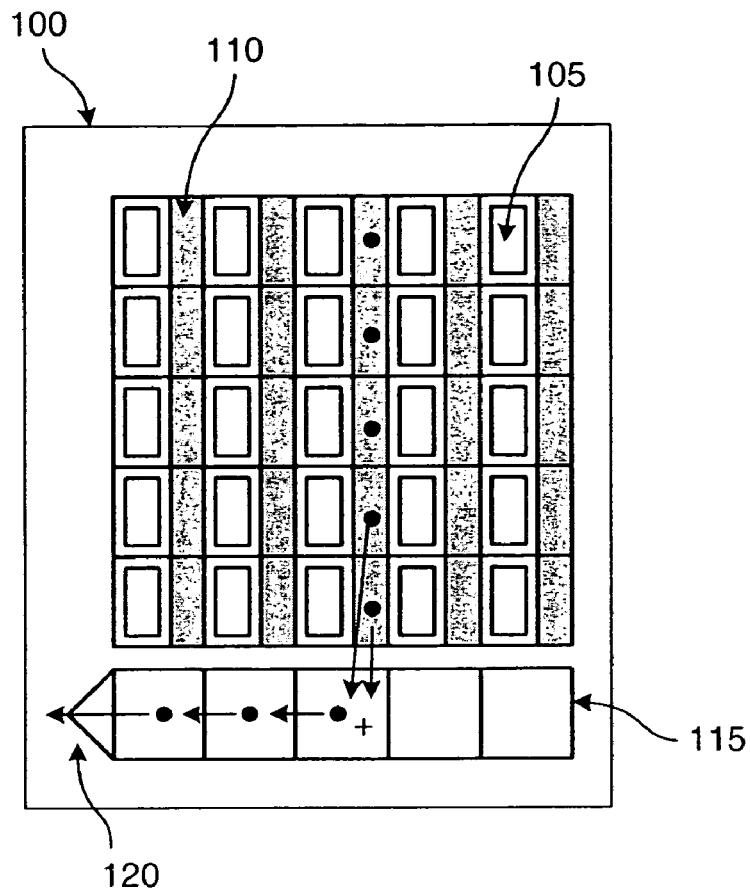
FIG. 4 is a top view of a prior art interline CCD illustrating the summing of two pixels.
Figure 5:
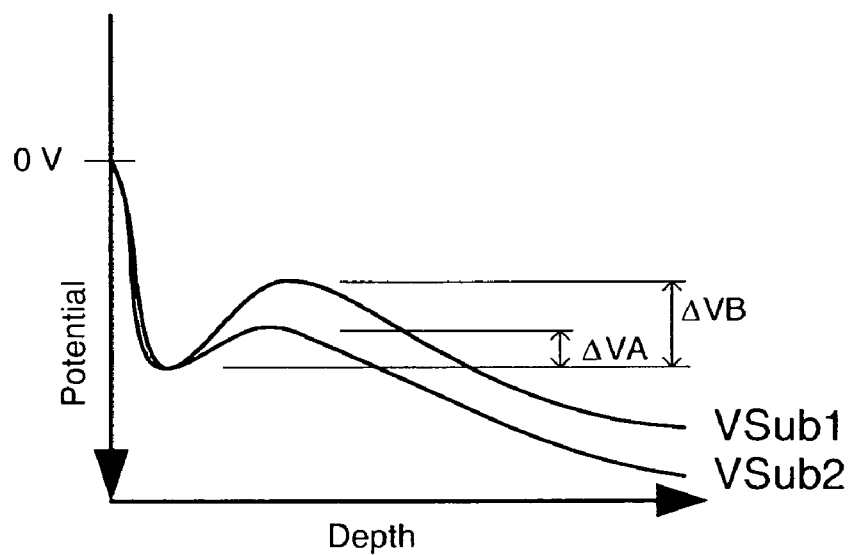
FIG. 5 is a graph of an interline CCD photodiode potential vs. silicon depth.
Figure 6:
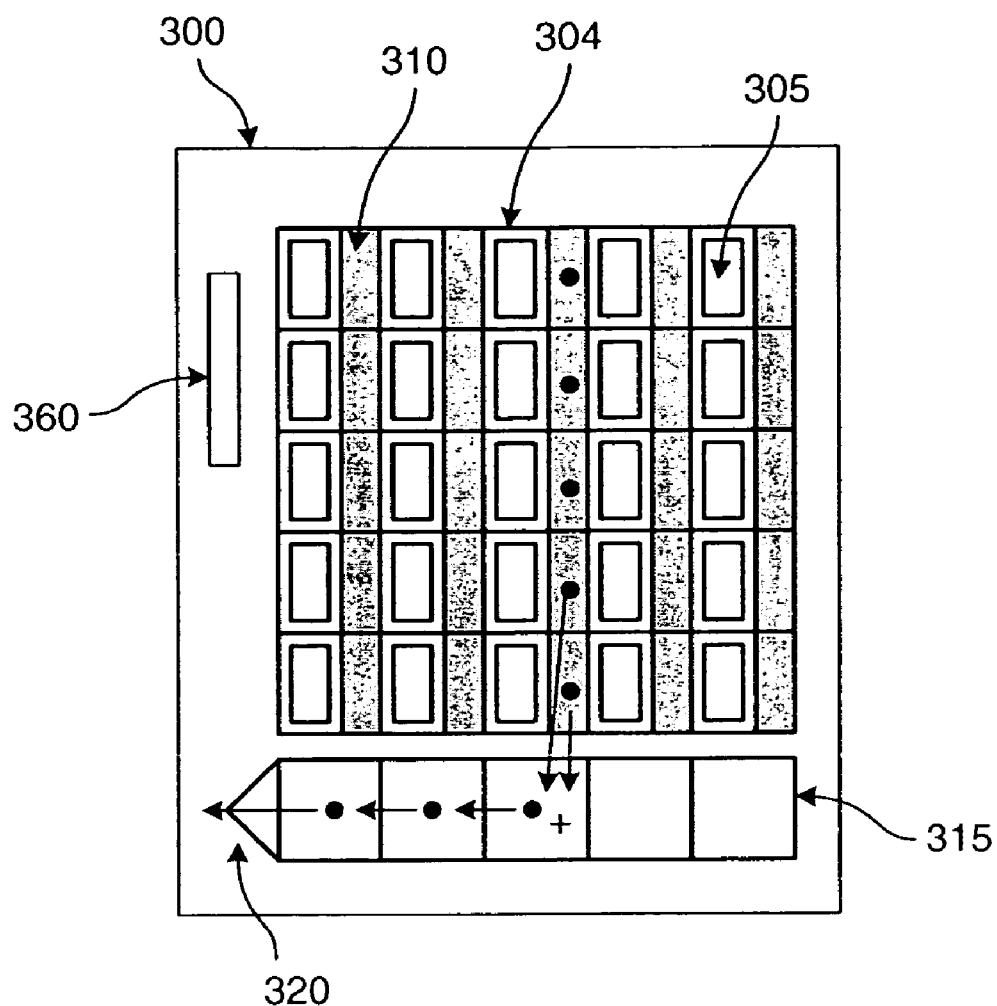
FIG. 6 is a top view of an image sensor of the present invention.

FIG. 6 shows an interline CCD image sensor 300 of the present invention with an integrated substrate reference voltage circuit 360 of the invention on the same silicon substrate. The image sensor 300 has an array of pixels 304 consisting of a photodiode 305, which collects charge in response to incident light (i.e., photons), adjacent to a vertical CCD shift register 310 that receives charge from the photodiodes. A horizontal CCD shift register 315 receives charge from the vertical CCD shift registers 310 and serially transfers charge to an output charge sensing node 320. The vertical CCD 310 is capable of summing together charge from two or more photodiodes 305 within the vertical CCD 310.

Figure 7:
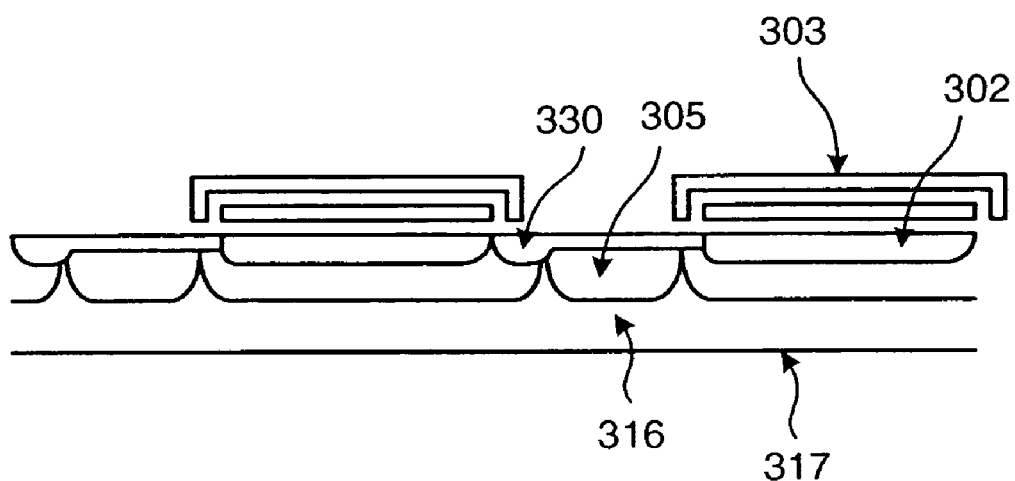
FIG. 7 is a cross section of FIG. 6.

FIG. 7 shows a horizontal cross section of one of the pixels 304. It consists of an n-type photodiode 305 under a p-type surface pinning layer 330 and above the lightly doped vertical overflow drain 316 in the n-type substrate 317. The opaque light shield 303 prevents the CCD shift register buried channel 302 from being sensitive to light. An equivalent image sensor can have all of the silicon doping polarities (n-type and p-type) exchanged.

Figure 8:
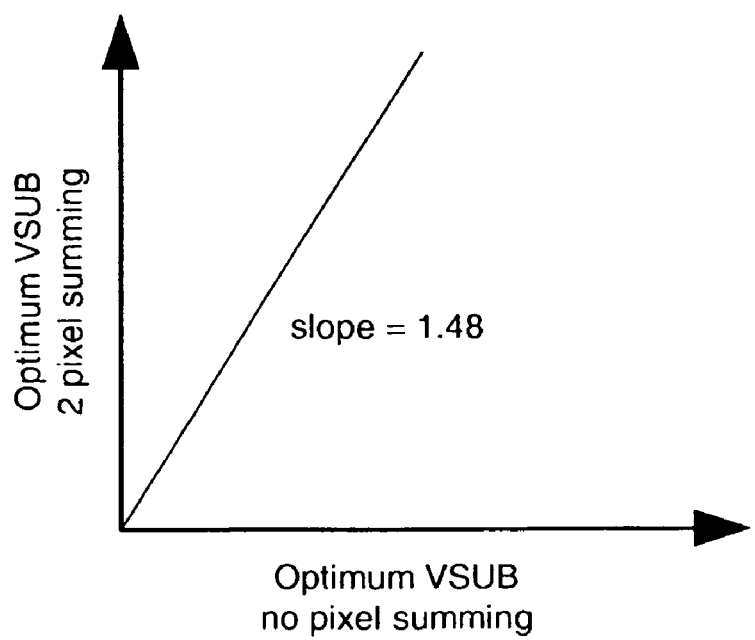
FIG. 8 is a graph illustrating the relationship between optimum substrate voltage for two pixel summing and optimum substrate voltage for no pixel summing.

To fully appreciate multiple substrate voltages, it is beneficial to understand the relationship between the various voltage references. First, consider an image sensor capable of operating in two imaging modes. The first mode is a full resolution image capture where no pixels are summed together. A second mode is where two pixels are summed together to increase frame rate or sensitivity. The optimal substrate voltage setting for the two pixel-summing mode would be such that the photodiode capacity is approximately half of the no pixel summing mode. By collecting data on the optimal substrate voltage for both modes, it becomes apparent that the two voltages are coupled. FIG. 8 shows the relationship between the optimum substrate voltage for two pixel summing vs. the optimum substrate voltage for no pixel summing. It is a straight line intersecting the origin.

Figure 9:
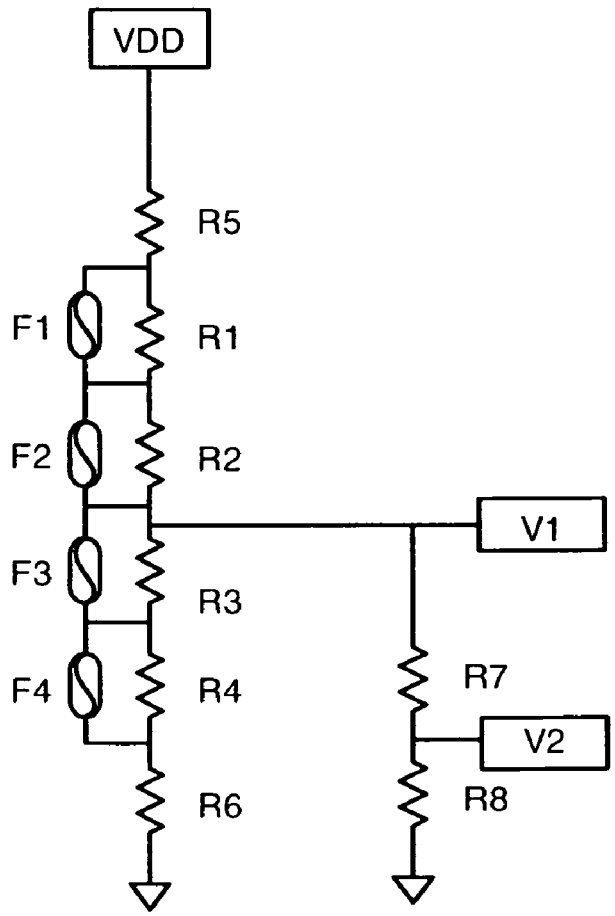
FIG. 9 is a schematic illustrating a dual substrate reference voltage circuit of the present invention.

FIG. 9 shows a circuit that will produce a second voltage V2 that can reproduce the straight line in FIG. 8. The possible values for V1 and V2 set by the fuses F1 through F4 can be calculated. V2 is the optimum substrate voltage for the full resolution un-summed image and V1 is the optimum substrate voltage for two pixel summing.

The current flowing out of the VDD power supply is given by:

$$i = \frac{VDD}{F_1 R_1 + F_2 F_2 + \dfrac{1}{\dfrac{1}{R_7 + R_8} + \dfrac{1}{F_3 R_3 + F_4 R_4 + R_6}}}$$

In the equations, F1 through F4 are values of 1 or 0 depending if the fuse F1 through F4 is conducting current or is blown. The V1 and V2 output voltages are given by:

$$V1 = VDD - i(R_5 + F_1 R_1 + F_2 R_2)$$

$$V2 = \frac{R_8}{R_7 + R_8} V1$$

Thus, V1 and V2 have a linear relationship and an intercept through the origin. The circuit of FIG. 9 uses the same number of fuses as the prior art but provides two reference voltage of exactly the correct value for pixel summing and non-pixel summing modes.

Figure 10:
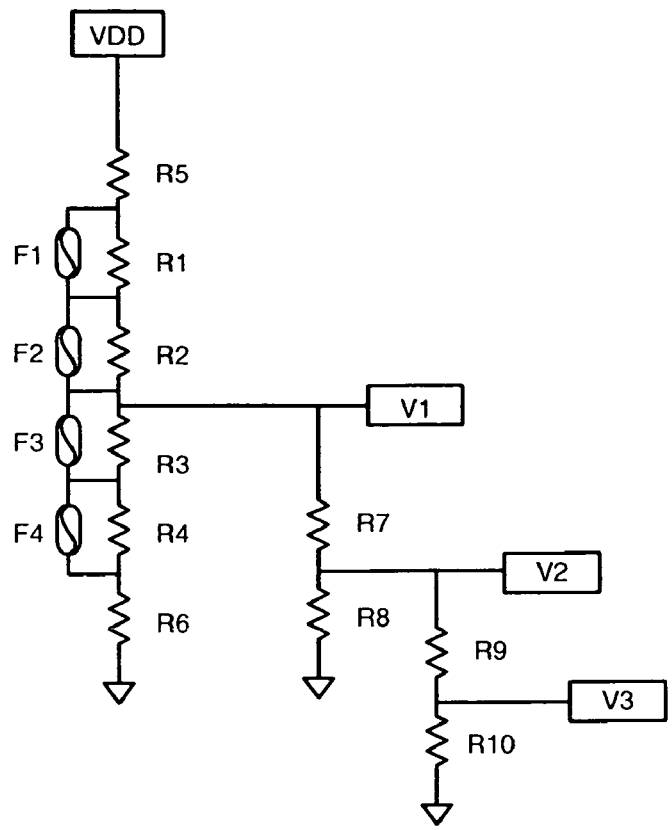
FIG. 10 is a schematic illustrating a multiple substrate reference voltage circuit of the present invention.
Figure 11:
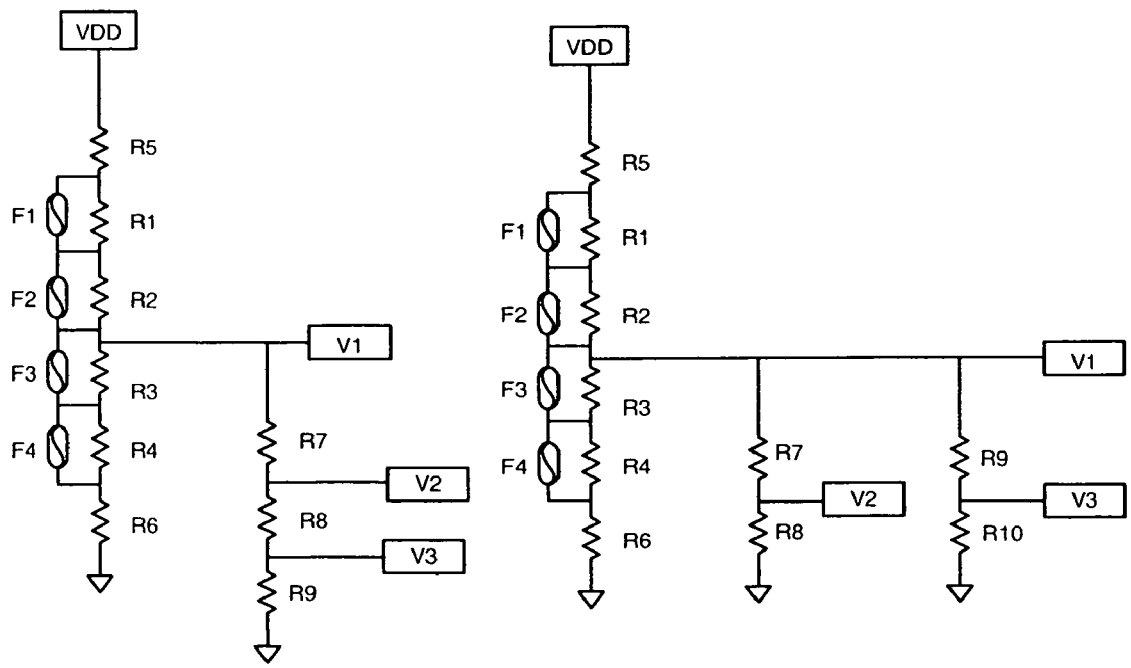
FIG. 11 is a schematic illustrating a multiple substrate reference voltage circuits using resistors of the present invention.

Interline CCDs are not limited to summing only 2 pixels. It is possible for one sensor to have multiple levels of pixel summing. For example, an image sensor might take full resolution pictures and also have video modes with 2, 4, or 8 pixel summing. Odd numbered pixel summing is also possible such as a color image sensor with the Bayer color filter pattern summing 3×3 (9 pixel) sub-arrays of like colors. All of these pixel-summing modes will need reference voltages on one image sensor. The solution is to extend the circuit of FIG. 9 to the circuit shown in FIG. 10 where another voltage divider operating off the V2 voltage generates a third voltage V3. FIG. 11 shows two variations of the circuit in FIG. 10 that can generate a third voltage V3. From, these examples it should be clear how to add an unlimited number of additional voltage dividers to generate more substrate voltage references.

Figure 12:
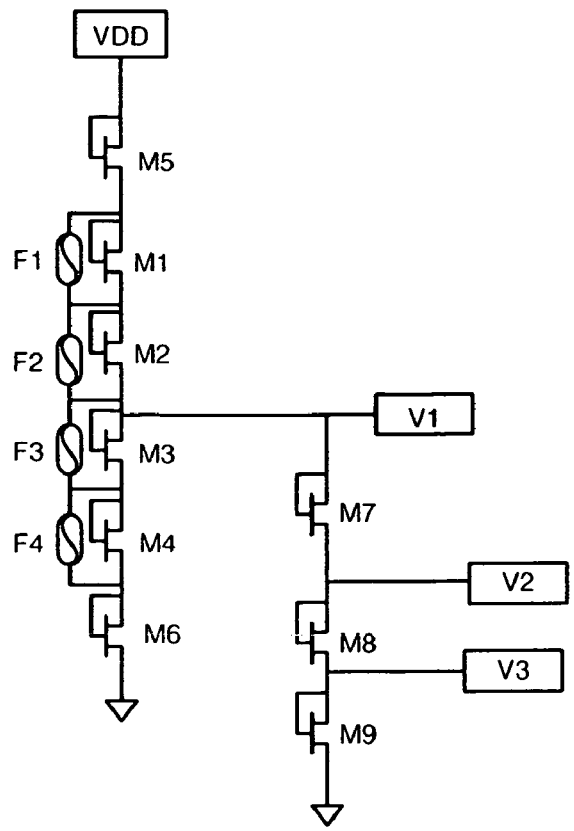
FIG. 12 is a schematic illustrating a multiple substrate reference voltage circuit using FETs.
Figure 13:
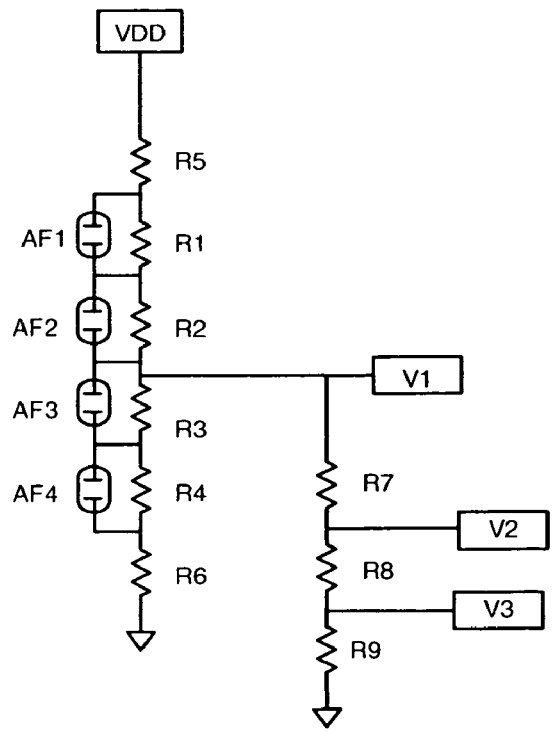
FIG. 13 is a schematic of a multiple substrate reference voltage circuit using anti-fuses of the present invention.

It is also equivalent to replace the resistors by field effect transistors (FET) as shown by the circuit in FIG. 12. Another variation is shown in FIG. 13. Here anti-fuses AF1 through AF4 have replaced the fuses. A fuse is initially a conductive link and then an external stimulus such as a high current pulse or laser-cutting beam is used to open the conductive link. The anti-fuse is initially an open link that is then fused together by an external stimulus such as a high voltage that breaks down an insulating layer between two conducting plates.

Figure 14:
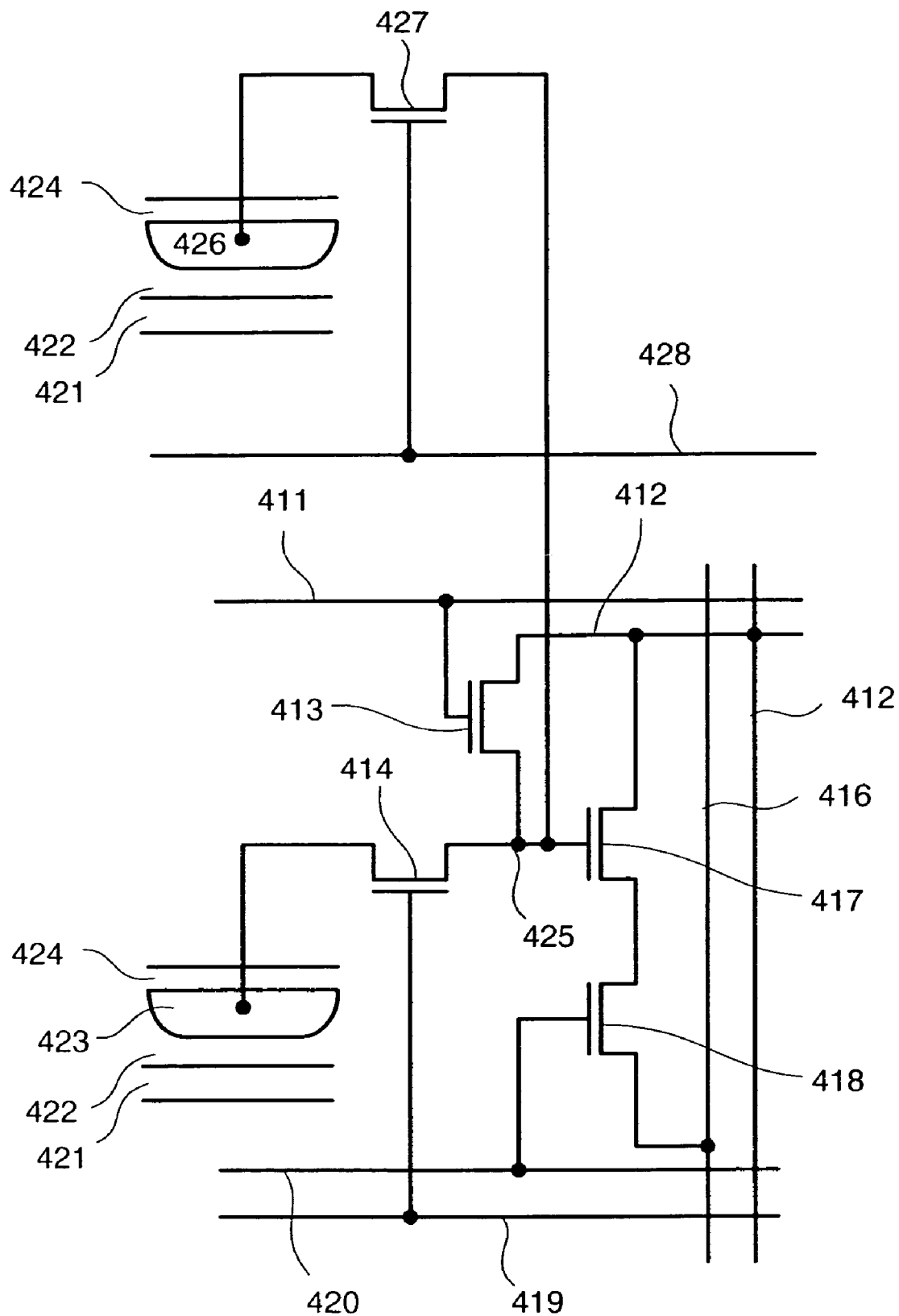
FIG. 14 is a schematic of a CMOS image sensor pixels with charge summing capability of the present invention.

The present invention is not exclusive to only CCD type image sensors. CMOS type image sensors also can benefit from the invention. FIG. 14 shows two CMOS image sensor pixels. There is one photodiode 426 and 423 for each pixel. The photodiodes have a surface pinning layer 424 and a vertical overflow drain 422. The charge capacity of the photodiodes 426 and 423 is regulated by the overflow drain 422 barrier height that is in turn controlled by the voltage applied to the substrate 421. Charge from the photodiode 426 is transferred to a shared floating diffusion 425 by a transfer gate 427 controlled by the signal line 428. Charge from the photodiode 423 is transferred to a floating a shared floating diffusion 425 by a transfer gate 414 controlled by the signal line 419. Each photodiode signal charge can be read either by transferring independently to the floating diffusion 425 or in a pixel summing operation both transfer gates 414 and 427 are turned on at the same time to sum two pixels together. The floating diffusion 425 is reset by transistor 413 controlled by signal line 411. Transistor 417 is preferably a part of a source follower connected to a power line 412. Transistor 418 is a row select transistor turned on by signal line 420 to connect the source follower to the signal output line 416.

This CMOS pixel structure allows two-pixel summing or no pixel summing read out modes. It can also be extended to allow for 3 or 4 pixel summing options. In the case of pixel summing is it desirable to use the overflow drain reference voltage circuit invention to supply reference voltages for each of the pixel summing modes.

Figure 15:
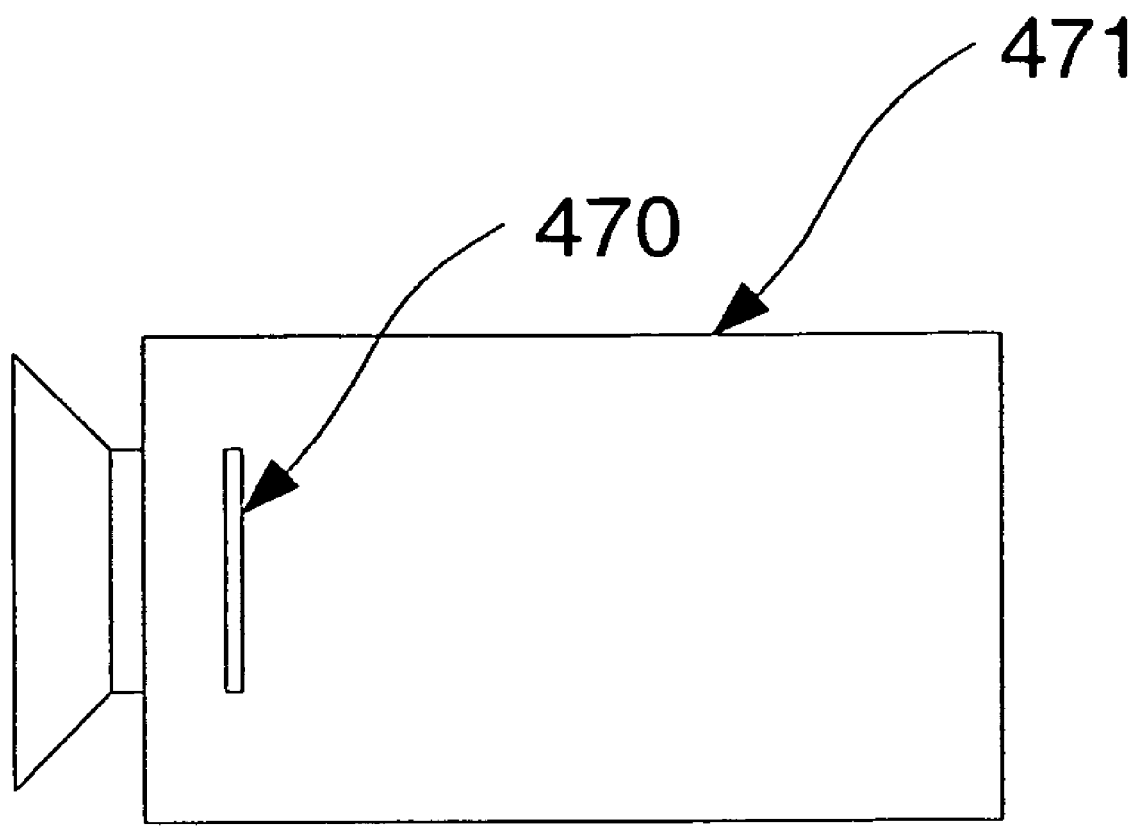
FIG. 15 is a camera imaging system using and image sensor having multiple substrate reference voltages of the present invention.

FIG. 15 shows a camera imaging system 471 (preferably a digital camera) employing an image sensor 470 with the integrated overflow drain voltage reference circuit of the present invention. The present invention permits the digital camera system 471 to operate in full resolution picture taking modes as well as lower resolution pixel summed motion video imaging modes with optimal anti-blooming protection and saturation signal level.

PARTS LIST 100 charge-coupled device
105 photodiode
110 vertical charge-coupled device
115 horizontal charge-coupled device
120 amplifier
200 buried channel
205 p well
210 substrate
215 overflow drain
220 gate
225 opaque metal layer
230 pinning layer
300 image sensor
302 buried channel
303 light shield
304 pixels
305 photodiode
310 vertical CCD shift register
315 horizontal CCD shift register
316 overflow drain
317 substrate
320 output charge sensing node
330 pinning layer
360 voltage circuit
411 signal line
412 power line
413 reset transistor
414 transfer gate
416 output line
417 transistor
418 transistor
419 signal line
420 signal line
421 substrate
422 overflow drain
423 photodiode
424 pinning layer
425 floating diffusion
426 photodiode
427 transfer gate
428 signal line
470 image sensor
471 camera imaging system

What is claimed is:

1. An image sensor comprising:
   (a) a plurality of pixels for converting incident photons into electrical charge;
   (b) an overflow drain to draw off excess charge from at least one or more of the pixels;
   (c) a mechanism for summing charge from two or more of the pixels;
   (d) a first network of resistive devices generating a first overflow drain voltage where at least one of the resistive devices has, in parallel, a fuse that can be opened in response to an external stimulus to provide the optimum overflow drain voltage for pixel anti-blooming protection and saturation signal level for when a plurality of pixels are summed together; and
   (e) a second network of resistive devices connected to the first network of resistive devices generating a second overflow drain voltage where the second overflow drain voltage is a fraction of the first overflow drain voltage and the second overflow drain voltage provides the optimum overflow drain voltage for pixel anti-blooming and saturation signal level for when none or substantially none of the plurality of pixels are summed together.

2. The image sensor of claim 1, further comprising a plurality of additional networks of resistive devices.

3. The image sensor of claim 1, wherein at least one of the resistive devices is a resistor.

4. The image sensor of claim 1, wherein at least one of the resistive devices is a field effect transistor.

5. The image sensor of claim 1, wherein at least one of the fuses is replaced by an anti-fuse.

6. The image sensor of claim 1, wherein the plurality of pixels form a charge coupled device.

7. The image sensor of claim 1, wherein the plurality of pixels are each connected directly to the gate of a field effect transistor or indirectly connected to the gate of a field effect transistor through a transfer gate and floating diffusion.

8. The image sensor of claim 1, wherein the number of plurality of pixels summed together is 2.

9. The image sensor of claim 1, wherein the number of plurality of pixels summed together is 3.

10. The image sensor of claim 1, wherein the number of plurality of pixels summed together is 4.

11. The image sensor of claim 2, wherein at least one of the resistive devices is a resistor.

12. The image sensor of claim 2, wherein at least one of the resistive devices is a field effect transistor.

13. The image sensor of claim 2, wherein at least one of the fuses is replaced by an anti-fuse.

14. The image sensor of claim 2, wherein the plurality of pixels form a charge coupled device.

15. The image sensor of claim 2, wherein the plurality of pixels are each connected directly to the gate of a field effect transistor or indirectly connected to the gate of a field effect transistor through a transfer gate and floating diffusion.

16. The image sensor of claim 2, wherein the number of plurality of pixels summed together is 2.

17. The image sensor of claim 2, wherein the number of plurality of pixels summed together is 3.

18. The image sensor of claim 2, wherein the number of plurality of pixels summed together is 4.

19. A camera comprising:
   an image sensor comprising:
   (a) a plurality of pixels for converting incident photons into electrical charge;
   (b) an overflow drain to draw off excess charge from at one or more of the pixels;

(c) a mechanism for summing charge from two or more of the pixels;

(d) a first network of resistive devices generating a first overflow drain voltage where at least one of the resistive devices has, in parallel, a fuse that can be opened in response to an external stimulus to provide the optimum overflow drain voltage for pixel anti-blooming protection and saturation signal level for when a plurality of pixels are summed together; and (e) a second network of resistive devices connected to the first network of resistive devices generating a second overflow drain voltage where the second overflow drain voltage is a fraction of the first overflow drain voltage and the second overflow drain voltage provides the optimum overflow drain voltage for pixel anti-blooming and saturation signal level for when none or substantially none of the plurality of pixels are summed together.

20. The camera of claim 19 further comprising a plurality of additional networks of resistive devices.

21. The camera of claim 19, wherein at least one of the resistive devices is a resistor.

22. The camera of claim 19, wherein at least one of the resistive devices is a field effect transistor.

23. The camera of claim 19, wherein at least one of the fuses is replaced by an anti-fuse.

24. The camera of claim 19, wherein the plurality of pixels form a charge coupled device.

25. The camera of claim 19, wherein the plurality of pixels are each connected directly to the gate of a field effect transistor or indirectly connected to the gate of a field effect transistor through a transfer gate and floating diffusion.

26. The camera of claim 19, wherein the number of plurality of pixels summed together is 2.

27. The camera of claim 19, wherein the number of plurality of pixels summed together is 3.

28. The camera of claim 19, wherein the number of plurality of pixels summed together is 4.

29. The image sensor of claim 20, wherein at least one of the resistive devices is a resistor.

30. The image sensor of claim 20, wherein at least one of the resistive devices is a field effect transistor.

31. The image sensor of claim 20, wherein at least one of the fuses is replaced by an anti-fuse.

32. The image sensor of claim 20, wherein the plurality of pixels form a charge coupled device.

33. The image sensor of claim 20, wherein the plurality of pixels are each connected directly to the gate of a field effect transistor or indirectly connected to the gate of a field effect transistor through a transfer gate and floating diffusion.

34. The image sensor of claim 20, wherein the number of plurality of pixels summed together is 2.

35. The image sensor of claim 20, wherein the number of plurality of pixels summed together is 3.

36. The image sensor of claim 20, wherein the number of plurality of pixels summed together is 4.

* * * * *